June 21, 1966 C. M. HENDERSON 3,256,701

THERMOELECTRIC UNIT AND PROCESS OF USING TO INTERCONVERT HEAT AND ELECTRICAL ENERGY

Filed Jan. 29, 1962

INVENTOR
COURTLAND M. HENDERSON

BY Herman O. Bauermeister
ATTORNEY

United States Patent Office 3,256,701
Patented June 21, 1966

3,256,701

THERMOELECTRIC UNIT AND PROCESS OF USING TO INTERCONVERT HEAT AND ELECTRICAL ENERGY

Courtland M. Henderson, Xenia, Ohio, assignor to Monsanto Company, a corporation of Delaware Filed Jan. 29, 1962, Ser. No. 169,536
9 Claims. (Cl. 62—3)

Figure 1:
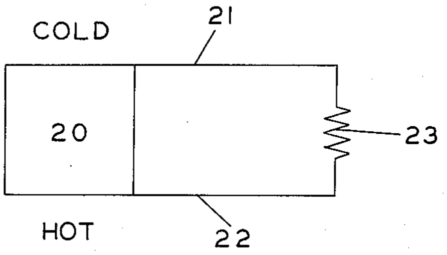

The present invention relates to thermoelectricity and novel thermoelectric elements as well as a process for manufacture thereof. It is an object of the invention to provide greatly improved thermoelectric combinations relative to presently known materials and devices. It is also an object of the invention to manufacture these novel thermoelectric elements and devices by an improved process in order to control the properties thereof. It is a further object of the invention to provide a method for producing said thermoelectric materials in a form which will provide either for the conversion of heat into electricity or the removal of heat by electricity at efficiences greater than are presently possible with currently available thermoelectric materials and devices.

One of the greatest obstacles preventing the more widespread commercialization of thermoelectric devices is the lack of materials of sufficient effectiveness, i.e., having sufficiently high merit factors to yield cooling, heating and power generating devices of thermal efficiencies high enough to make them economically competitive with their conventional mechanical counterparts. The relation of the thermoelectric parameters to Z, a merit factor of importance for heating, cooling and power generation applications, is shown below $$Z=S^2/\rho K$$

where $S$=the Seebeck coefficient,
$\rho$=electrical resistivity
and
$K$=thermal conductivity.

The higher the Z factor, the greater is the amount of refrigeration, heating or power generation that can be obtained from a thermoelectric material for a given energy throughput. The lower the product of the resistivity and the thermal conductivity, the higher the merit factor, when the Seebeck coefficient remains constant.

As is well recognized by those skilled in this art, thermoelectric materials have not yet been produced that will simultaneously exhibit high Seebeck coefficients, low electrical resistivities and low thermal conductivities to yield high enough merit factors and efficiencies to make them economically competitive with conventional devices.

Various routes have been followed in an attempt to overcome this obstacle. For example, attempts have been made to increase the merit factors of materials by decreasing the product of the resistivity and thermal conductivity through increasing the mobility of the carriers (e.g., electrons and/or holes) relative to the thermal conductivity of thermoelectric materials through the use of materials composed of atoms having large atomic weights. This approach, as represented by bismuth telluride or lead telluride, or the corresponding selenide type materials used for cooling, has not produced merit factors greater than $4\times10^{-3}/°$ C. and such materials often exhibit poor mechanical properties. The top merit factors for power generation materials operating at temperatures of 1000° C. and higher have been below $0.6\times10^{-3}/°$ C. Another popular approach has been to produce alloy type thermoelectric materials in which a homogeneous distribution of constituents in the alloy is obtained by solid solution, so as to decrease the product of the resistivity and the thermal conductivity of thermoelectric materials. This solid solution or alloy approach has resulted in less than a 10% increase in the Z merit factor for a given thermoelectric material and such materials exhibit poor mechanical properties.

Still another approach has been to form physical voids or holes in a given thermoelectric material. While some slight increase in the Seebeck coefficient occasionally results from this approach, improvement in the merit factor possible through this means is usually less than 5%. In the latter approach, the presence of voids (filled with a vacuum, air or other gas) reduced the strength and other mechanical properties of the thermoelectric material so that serious reductions in the life and performance of devices made from such materials more than offset the small gains in the efficiency obtained. In addition, it has been impractical to adequately control the concentration and placement of the voids to obtain the best results. Prior art has held that the presence of insoluble inclusions in the thermoelectric materials is detrimental to obtaining high Z factors.

The above problems are overcome and significant increases in the merit factor of semiconductor or thermoelectric materials is possible through the teachings of this invention. This invention follows an opposite approach from prior art teachings in that a stable compound or combination of compounds of the group of carbides of boron, thorium, aluminum, magnesium, calcium, titanium, zirconium, tantalum, silicon, vanadium, hafnium, columbium, tungsten, iron, tin, cobalt, nickel, rhenium, molybdenum, beryllium, barium, and rare earths of the lanthanide and actinide series are dispersed within the thermoelectric matrix materials as set forth below. Matrices of semiconductors or thermoelectric materials of this invention, within which the above group of carbides are dispersed consist of various combinations of elements existing as compounds, alloys, solutions and other combinations to produce materials with resistivities in a range between metals and insulators. Such materials are also characterized by large Seebeck coefficients and negative coefficients of resistivity. The criteria for matrix materials used in this invention are that their electrical resistivities fall in the range of $1\times10^{-4}$ ohm-cm. to $1\times10^{3}$ ohm-cm., their thermal conductivities lie within the range of $1\times10^{-3}$ watt/cm. ° C. to 1 watt/cm. ° C. and Seebeck coefficients in the range of 50 microvolts/° C. to 1000 microvolts/° C. Some typical semiconductor or thermoelectric matrix materials which are used in this invention include combinations of silver-seleniums, silver-antimony-telluriums, silver-antimony-seleniums, silver-antimony-tellurium-seleniums, bismuth-selenium-telluriums, bismuth-antimony-selenium and tellurium materials, bismuth-tellurium-sulfides, sodium-manganese-tellurium and selenium materials, manganese-tellurium-arsenides, lead-tellurium and selenium materials, indium-antimony materials, germanium-tellurium and selenium materials, indium-arsenides, indium-arsenide-phosphides, transition metal oxides such as nickel oxide, manganese oxide, zinc oxide and others, copper oxide, zinc-antimony materials, manganese-silicons, chromium-silicons, gallium-phosphorus, gallium-arsenides, manganese-tin materials, rare earth sulfides (e.g., cerium sulfide and gadolinium sulfide), cobalt-silicons, iron-silicons, nickel-silicons, gadolinium-selenides and tellurides, tantalum-telluriums, columbium-tantalum-tellurium and selenium materials, silver-antimony-sulfides, copper-gallium-telluriums, copper-zinc-arsenides, nickel-zinc-antimonides, silver-arsenic-seleniums, silver-chromium-telluriums, silver-iron-telluriums, silver-cobalt-telluriums, silver-indium-telluriums, boron-doped carbons, silicon-doped carbons, doped boron carbides, doped-borons, hafnium-silicons and variations of all the above matrices doped with nonstoichiometric portions of various elements such as carbon, titanium, zirconium, beryllium, copper, iron, cobalt, nickel, lithium, germanium, selenium, tellurium, silicon, chromium and others. All of the above matrices, doped or otherwise, which fall within the stipulated ranges of resistivity, thermal conductivity and Seebeck coefficients are significantly benefitted through the incorporation of appropriate quantities of the above group of refractory additive carbides.

The materials of this invention are to be distinguished from nonstoichiometric compounds or single phase solid solutions of conventional semiconductor or thermoelectric materials. Further, they are to be distinguished from the impurity compounds and randomly dispersed inclusions resulting from the reaction of the matrices of conventional semiconductor or thermoelectric materials with their environments, such as oxygen, during processing. The size, spacing and concentration of the dispersants of this invention in the base or matrix semiconductor (also called thermoelectric materials herein) permit significantly greater variations and control of the relation between the electrical resistivity and thermal conductivity and to some extent the Seeback coefficient than has been possible with prior art practices. This is done by causing the additive particles, which are largely insoluble in the matrix materials, to be placed close enough to each other so as to affect the lattice structure of the matrix materials and to impede the flow of thermal energy, as by phonons, more than the flow of electrical charge carriers (electrons, holes, ions and others). Dispersion of such additive particles usually has a beneficial effect on the Seebeck coefficient, but the main result is to permit a net decrease in the product of the resistivity and the thermal conductivity with a corresponding increase in the merit factor for the aforesaid thermoelectric materials.

From the viewpoint of optimizing device performance it is also desirable to provide semiconductor or thermoelectric materials in which the resistivity and thermal conductivity can be controllably varied along energy flow paths. Ability to vary and control the thermoelectric parameters such as the Seebeck coefficient, electrical resistivity and thermal conductivity for both "p" and "n" type materials, through use of additives or dispersants as prescribed herein, has resulted in typical merit factor increases approaching an order of magnitude for the modified thermoelectric materials as compared with unmodified ones. In addition, the dispersion of the presently characterized small strong particles or nuclei through the matrix of semiconductor or thermoelectric materials adds appreciably to their strength and other physical properties.

For example, when semiconductor materials are to be used at temperatures high enough to cause their destruction by oxidation, presence of the dispersed refractory materials in the matrix thermoelectric material improves their resistance to such attack. Further the presence of these dispersed particles enhances the bonding of ceramic type coatings, as well as the bonding of electrical and thermal leads to the thermoelectric element, since it is often possible to more readily join an oxide or refractory protective coating or heat resistant electrical and thermal leads to the improved matrix thermoelectric materials by sintering the protective coating or lead elements to the surface of the matrix material where the dispersed particles are present. For example, it is found that aluminum carbide dispersed in a matrix of cerium sulphide greatly improves the bonding of a protective high temperature coating of nickel alumina to the matrix material. Oxidation of the nickel in the nickel alumina coating at elevated temperatures in air permits the coating to react with the finely dispersed additive in the surface of the matrix to form a spinel like compound thus producing a strong adherent bond between the thermoelectric element and the coating.

In addition, this invention includes a process for manufacturing thermoelectric elements of improved merit factors by producing and maintaining mechanical strain in the lattice of matrix thermoelectric materials through the use of dispersants and severe fabricating conditions, such as high pressures. A second method used in this invention for inducing strain into the lattice of the semiconducting matrix materials, in order to obtain improved merit factors is to use refractory phases which have larger co-efficients of expansion than the semiconductor or thermoelectric matrix materials in which they are dispersed. This practice is most useful for power generating devices in which the thermoelectric material is to be heated to high operating temperatures.

The induction of stress or strain by either of the above methods into the matrix thermoelectric material lattice offers an additional means of preferentially causing the thermal conductivity of such matrix materials to decrease more than the resistivity increases, since the flow of heat by phonons can be preferentially impeded more than the flow of charge carriers (electrons, ions, and holes). The dispersed particles serve to lock or retain for long periods of time the desired degree of strain within the matrix lattice by preventing or greatly retarding the flow of dislocations that would release such strain, or stress, within the lattice of the matrix material.

Figure 2:
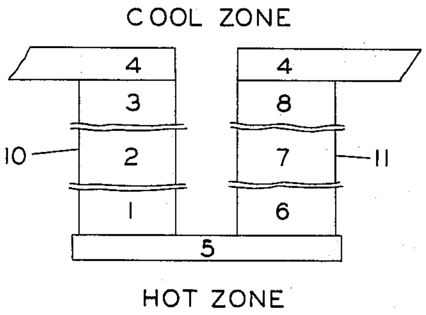
Figure 3:
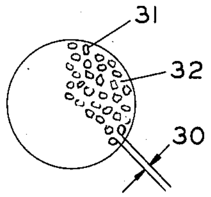

The drawings of the present invention illustrate specific devices of the present invention, and the use thereof. FIGURE 1 presents a typical cooling, heating or power generating circuit in which units of the present invention are useful. FIGURE 2 shows a typical cooling-heating or power generating type unit in which both the dispersed particles and the greater thermoelectric property aspects of this invention are demonstrated. FIGURE 3 shows the elements of the micro-structure of a compacted thermoelectric element made from the materials of this invention.

The composition of matter contemplated by this invention comprises controlling the composition to contain broadly from 0.001% to 49% by volume of at least one small particle refractory phase that is homogeneously dispersed through a matrix of thermoelectric material, the balance of the composition substantially being made up of the matrix material. A more preferred composition would contain from 0.001% to 40% by volume of at least one small particle refractory phase dispersed in a matrix of thermoelectric material. The most preferred composition contains from 0.1% to 35% by volume of the small particle refractory phases dispersed through a matrix of the thermoelectric material. In general, the dispersed phase should be substantially insoluble in the matrix material and otherwise meet the criteria that the melting point (absolute temperature) of the refractory phase should exceed the melting point (absolute temperature) of the matrix material in which they are dispersed, by a factor of 105%. More preferably, the melting point of the dispersed phase should exceed the melting point of the matrix material by 110%. Most preferably, the absolute melting point of the refractory dispersed phase should exceed that for the matrix by 115%. Broadly, the size of the particles of the dispersed phase should be larger than 50 A. but not exceed 500,000 A., with preferred sizes ranging from 100 A. to 400,000 A. and most preferably between 200 A. and 350,000 A. Useful interparticle distances between particles of nuclei range from 50 A. to 500,000 A. A more preferred interparticle spacing of the dispersed particles in the matrix ranges from 100 A. to about 350,000 A., with the most preferred interparticle spacing for optimum properties ranging from 200 A. to less than 200,000 A.

The matrix of the semiconductor or thermoelectric material in which the small particles are dispersed is characterized by an electrical resistivity in the range of $1 \times 10^{-4}$ ohm-cm. to $1 \times 10^{3}$ ohm-cm. with a thermal conductivity in the range of $1 \times 10^{-3}$ watts/cm. °C. to 1 watt/cm.° C. and a Seebeck coefficient in the range of 50 microvolts/° C. to 1000 microvolts/° C.

The following examples illustrate specific embodiments of the present invention and show various comparisons against prior art compositions and materials.

*Example 1*

As a specific example of typical results obtainable through the teachings of this invention in producing superior high temperature power generating materials and devices, 14 volume percent of thorium carbide consisting of particles ranging in size from 100 A. to 10,000 A. is homogeneously distributed through a boron matrix doped with 10 volume percent of carbon so that the approximate average interparticle spacing between the thorium carbide particles in this doped boron matrix is 280 A. after compacting at 1850° C. and 5000 p.s.i. The Z factor of the unmodified carbon-doped boron matrix material is $0.8\times10^{-3}/°$ C. at about 1200° C. The Z factor for the modified carbon-doped boron matrix with dispersed thorium carbide specimen is $1.8\times10^{-3}/°$ C. at about 1200° C., or about 125% higher than the Z factor for the unmodified specimen of the same carbon-doped boron composition for the same operating temperatures. It is found that the product of the electrical resistivity and thermal conductivity of the modified material is decreased by about 75% below the product of the electrical resistivity and thermal conductivity of the unmodified material. The Seebeck coefficient of the modified matrix is increased by about 7% over the Seebeck coefficient of the unmodified material. Thus, the combination of the square of the slightly increased Seebeck coefficient and greatly decreased product of the electrical resistivity and thermal conductivity results in the very substantial 125% increase in the merit factor of the modified thermoelectric material over the unmodified material.

*Example 2*

A specific example of typical results obtained when a conventional cooling or refrigeration type thermoelectric material is modified by the teachings of this invention is shown when a bismuth selenide matrix with 1.2% excess selenium is modified by having dispersed within it 8% by volume of silicon carbide. Particle size of the silicon carbide ranges in size from 150 A. to 200,000 A. This composition is compacted at room temperature under 150 p.s.i. pressure. The resulting compacts show interparticle spacings between the additive dispersant particles varying from 200 A. to 350,000 A. The Z factor of the unmodified bismuth selenide matrix processed in the same die and at the same pressure and temperature is only $1.8\times10^{-3}/°$ C., e.g., as compared with $6.2\times10^{-3}/°$ C. for the dispersed additive-modified matrix material when tested under the same conditions. This represents an increase of about 240% in the merit factor for the modified over the unmodified bismuth selenide material.

Similarly, significant increases in the merit factors of various other low temperature or cooling type matrix materials are obtained by dispersing refractory compounds to meet the prescribed interparticle spacing conditions.

Various methods are used for producing the modified thermoelectric materials of this invention. In general, powder metallurgy and ceramic fabrication methods are employed. Such methods make use of fine particle powders which are compacted into final or intermediate shapes at high pressures and temperatures. Fine particle powders of rounded or near spherical shapes are preferred, but irregularly shaped powder particles are satisfactory. Pressure forming, as by mechanical dies, hydrostatic compaction, and extrusion may be used. Hot pressing is also used, if care is taken to carry out the operation at temperatures and under protective atmospheres that will not damage the thermoelectric matrix material through harmful phase changes, melting, or loss of components through evaporation.

One preferred method of producing the improved thermoelectric units characterized by homogeneous dispersion is to mechanically blend fine particle powders of the matrix thermoelectric material with the proper proportions of a dispersant of lower thermal conductivity. Such blended powder is then charged into a metal die where it is compacted to a minimum of 75% of theoretical density (for any given composition) under pressures ranging from 0.25 to 200 tons per square inch. For low temperature materials and devices, the compacted powder blend can be formed directly into a unit to which may be attached electrical and thermal leads, such as elements 4 and 5 of FIGURE 2. The same procedure can also be used for high temperature units, but it is often more practical to attach high temperature leads in a separate action, as by spot welding or brazing.

Sintering of the compacted elements to temperatures as high as 95% of the melting point of the matrix material improves the physical properties of the compact. In many cases, it is advantageous to attach the electrical and thermal leads to the compacted thermoelectric element during this sintering step.

*Example 3*

Specifically, when a silver-antimony-tellurium powdered matrix material is mechanically blended with 7 volume percent of zirconium carbide and the mixture compacted in a die at 125 tons per square inch, thermoelectric elements are produced which exhibit Z factors of about $5.1\times10^{-3}/°$ C. The same matrix material has not yielded elements of greater than $3.5\times10^{-3}/°$ C. Thus, an increase of about 43% in the Z factor results in this case through the use of zirconium carbide homogeneously dispersed through a matrix (element 32 of FIGURE 3) of silver-antimony-tellurium. The average spacing (element 30 of FIGURE 3) between particles of the additive (element 31 of FIGURE 3) range in size from 50 A. to 200,000 A.

When a thermoelectric cooling unit consisting of the above materials and equipped with junctions and leads, elements 21 and 22 of FIGURE 1 is connected in series with a power source, element 23 of FIGURE 1, the temperature difference between the hot and cold junctions, which is indicative of the cooling capacities for the modified thermoelectric material, is about 30% greater than for the case of the unmodified material.

*Example 4*

When thermoelectric elements are to be used over a large temperature differential, it is important to provide such elements with a gradation in properties along the path of energy flow and particularly heat flow through such elements.

In this example, carbon-doped boron and cerium sulphide matrices are doped with titanium carbide and boron carbide respectively. Whether for cooling, heating or power generation, heat flow occurs from the hot zone to the cold zone through composite elements or legs 10 and 11 of FIGURE 2. For a case when a device of the configuration of FIGURE 2 is used to generate power, element 10 consists of 3 segments; elements 1, 2 and 3. For high efficiency of energy conversion, element 1 should have about the same merit factor as elements 2 and 3. Likewise element 6 of leg 11 has about the same merit factor as elements 7 and 8. For the case at hand, element 10 consists of a "p" type material while the polarity of element 11 is "n" type. Element 5 of FIGURE 2 is an electrical and thermal contact between legs 10 and 11 and the energy source, or hot zone. Element 4 serves as electrical and thermal contact for the cold side of the thermoelectric unit of FIGURE 2.

A superior generator is obtained when elements 10 and 11, consisting respectively of carbon-doped boron and cerium sulfide matrix materials are mechanically strengthened and thermoelectrically improved by dispersions of the above two additives respectively. The thermoelectric elements for this generator unit, similar in construction to that shown in FIGURE 2, are produced as follows:

Mechanical blends of fine particle (500 A. to 450,000 A.) carbon-(11 vol. percent) doped boron with fine particle titanium carbide (100 A. to 350,000 A.) are produced. The blend for element 1 consists of a mixture of a nominal 12 volume percent titanium carbide with a nominal 88 volume percent carbon-doped boron. This powder blend is poured into the bottom of a boron nitride lined carbon mold, or compaction die, large enough to hold the powder charge for elements 1, 2 and 3. Next a powder blend of nominal 7 volume percent titanium carbide in the carbon-doped boron matrix (for element 2) is added on top of the 12 volume percent titanium carbide carbon-doped boron mix in the compaction die. Following this, a powder blend of a nominal 0.3 volume percent of titanium carbide in carbon-doped boron is placed on top of the loose powder for element 2. The volume ratio of elements 1, 2, 3 of leg 10 is approximately 0.5:1.5:1, respectively, for this example. Other ratios of element volume for "p" type legs are similarly used. Next, the compaction die is equipped with a male top and bottom ram to form a powder metallurgy hot-press type compaction-die assembly. This die assembly is then centered in an induction heating coil and the male rams connected with a means for applying pressure to them. A protective atmosphere of argon is provided for the die assembly. Heat is applied to the die assembly by induction and pressure equivalent to 3 tons per square inch of ram area exerted on the loose powder. Upon heating to 2000° C. under the above pressure, compaction is completed in 5 minutes to produce a segmented type element or leg 10 of about 99% of the theoretical density for the segments.

Element or leg 11 is produced in a similar fashion from a matrix of cerium sulphide (2000 A. to 450,000 A.) modified by dispersed boron carbide powder (500 A. to 400,000 A.). A blend of a nominal 18 volume percent boron carbide in cerium sulphide matrix is placed in the bottom of a second boron nitride lined graphite or carbon die as the charge for segment or element 6. Next a nominal 7 volume percent blend of boron carbide in cerium sulphide (the powder composition for element 7) is placed on top of the 18 volume percent boron carbide in cerium sulphide charge. Next a charge consisting of a nominal 1% boron carbide blended with cerium sulphide, to provide element 8, is placed in the die. The ratio of the volume of elements 6, 7, 8 for this example is 0.7:1.5:0.8. As practiced to produce element 10 of this example, male plungers or dies are added to the die assembly before placing the die in an induction powered coil for heating to 1500° C. for 10 minutes under a unit pressure of 5000 p.s.i. to produce element 11.

The hot electrical and thermal element 5 of the thermoelectric module shown in FIGURE 2 is attached to legs 10 and 11 by simultaneously bonding leg 10 to elements 5 and 4 at temperatures of 900° C.–1700° C. while holding these elements at unit pressures 300 p.s.i. at such temperatures for 1–10 minutes. Element 5, in this particular example consists of graphite while element 4 is commercial nickel. Elements 4 and 5 are attached to the thermoelectric leg 11 by the same technique, but lower temperatures are used, e.g., 800–950° C.

Overall merit factors of $2.27\times10^{-3}/°$ C. and $$1.35\times10^{-3}/°\text{ C.}$$

are obtained from segmented type legs 10 and 11, respectively, when such legs consisting of segments or elements 1, 2, 3, 6, 7 and 8 are produced from the said matrix thermoelectric materials modified by homogeneous dispersions of the said refractory additive materials, and the units operated between 500° C. and 1400° C. By comparison, the merit factors are $0.80\times10^{-3}/°$ C. power and $0.5\times10^{-3}/°$ C. power, respectively, for legs 10 and 11 comprised of the same composition but unmodified matrix materials, and operating over this same temperature range. Thus, improvements of approximately 182% and 165% are obtained for matrices of doped boron and cerium sulphide, respectively, by the compositions, process and configurations of this example.

Similar improvements of merit factors for other matrix materials are obtained through practice of the technique of providing thermoelectric legs comprised of thermoelectric segments of different concentrations of dispersants of refractory particles. While only one refractory dispersant is used in a single thermoelectric matrix per leg in this example, each segment is readily produced from a different matrix and different dispersants.

*Example 5*

A process similar to that used in Example 4 is employed to fabricate elements 10 and 11 of FIGURE 2 to yield legs in which the thermoelectric properties are more smoothly varied to produce legs which operate with higher merit factors over the same temperature drop than those of the segmented type legs of Example 4. For example, continuously varied or gradated composition type legs 10 and 11 for the device shown in FIGURE 2 of this example are produced by feeding a continuously changing composition of titanium carbide-doped boron and boron carbide-cerium sulphide constituents into a compaction die. In this manner, the lower portion of element 1 which is to be joined to element 5 of FIGURE 2 is comprised of a 14 volume percent mixture of titanium carbide with carbon-doped boron. The composition of the succeeding layers of powder blend fed into the compaction die to form element 1 is graduelly decreased in titanium carbide content until at the junction of elements 1 and 2 of FIGURE 2 the composition reaches 10 volume percent titanium carbide to yield an average composition for element 1 of about 12 volume percent. The dispersed titanium carbide content is then continuously decreased with increasing layers of powder charged into the die to form elements 2 and 3 with smoothly gradated composition which average 7 volume percent and 0.3 volume percent respectively. The approximate volume ratios of elements 1, 2 and 3 of leg 10 are 0.5:1.5:1, as used in Example 4. Following charging of the powder to the die assembly in this way, compaction by pressure and elevated temperatures proceeds as previously described in Example 4. Elements 6, 7 and 8 of leg 11 are made in the same manner as are elements 1, 2 and 3 of leg 10 to produce elements in which the composition decreased continuously from 20 volume percent boron carbide in cerium sulphide at the interface between elements 5 and 6 to 16 volume percent boron carbide in cerium sulphide at the junction of elements 6 and 7, from 16 volume percent titanium carbide to 3 volume percent titanium carbide in cerium sulphide at the junction of elements 7 and 8 and from 3 volume percent titanium to carbide 0.1 volume percent boron carbide at the interface of elements 8 and 4. Merit factors of $2.32\times10^{-3}/°$ C. power and $$1.40\times10^{-3}/°\text{ C.}$$

respectively, are produced for legs 10 and 11 in a typical device configuration shown in FIGURE 2 using the gradated type elements of this example when the units of the type shown in FIGURE 2 are operated at temperatures ranging from 500° C. to 1390° C., essentially the same tmeperatures used in Example 4.

Similar improvements of merit factors for other matrix thermoelectric materials are obtained when smoothly gradated concentrations of dispersants are used to provide thermoelectric legs of gradated thermoelectric properties by the processes used in this example.

*Example 6*

A specific example of typical results in producing superior thermoelectric materials and devices, through the inducement of strain into the lattice of matrix thermoelectric materials, so as to beneficially decrease the product of the electrical resistivity and thermal conductivity of such materials through dispersion of refractory phases with high expansion coefficients relative to the thermal expansion coefficients of matrix materials, is shown by comparing the merit factor obtained for a carbon-doped boron thermoelectric matrix material with 14 volume percent stabilized additive of the present invention dispersed in it to the merit factor for the same composition carbon-doped boron matrix in which 14 volume percent of tungsten is used as the dispersed phase. Individual thermoelectric elements, such as element 20 of FIGURE 1 produced under identical pressing conditions and by incorporating the above quantities of zirconia and silicon carbide in an identical matrix material when each of the individual thermoelectric elements is equipped with proper leads (elements 21 and 22 of FIGURE 1) to a measuring circuit 23, exhibit different merit factors when operated over the same temperature drop. Specifically, a merit factor of $0.95\times10^{-3}/°$ C. at 1275° is obtained for the thermoelectric carbon-doped matrix material in which 14 volume percent zirconium carbide is homogeneously dispersed prior to hot pressing at 1650° C. and 5000 p.s.i. By comparison, an identical carbon-doped matrix composition in which 14 volume percent of tungsten is homogeneously blended prior to compacting into a test piece under identical temperatures and pressure fabrication conditions, as well being fabricated with identical thermal and electrical contacts, exhibits a merit factor of only $0.68\times10^{-3}/°$ C. at 1280° C. The improvement in the merit factor for the matrix material obtained with tungsten as compared with zirconium carbide is larger than can be accounted for by the relative thermal and electrical conductivities of the dispersants. The results obtained are more in line with the ratio of the cubic expansion coefficients of each dispersant and their effect on lattice strain for the thermoelectric matrix materials. The greater the differences between the expansion coefficients of the dispersants and the matrix materials, the greater and more beneficial is the effect on the merit factor of the dispersion modified thermoelectric materials.

It is also possible to use the same additive in both the "p" and "n" type legs of thermoelectric modules or devices typified in Examples 5 and 6 so long as the dispersed phase is substantially insoluble in the matrix material and otherwise meets the above criteria that the melting point (absolute temperature) of the refractory phase should exceed the melting point (absolute temperature) of the matrix material in which they are disposed by a factor of 105%, preferably 110%, and more preferably by 115%, relative to the melting point of the matrix as 100%.

Similarly exceptional results are obtained when the same refractory additives as described in Examples 5 and 6 with different matrices are used to form legs 10 and 11 of FIGURE 2 by the technique described in Examples 5 and 6. Thus, element 1 of leg 10 of FIGURE 2 is preferably one of the high temperature materials (e.g., "p" type doped boron) capable of withstanding the temperature of the energy source such as 1300° C. Element 2 consists of a modified matrix material (e.g. "p" type indium antimony arsenide) that operates with an efficiency or Z factor over a temperature range somewhat lower than that for element 1. Element 3 is comprised of a modified matrix (e.g., "p" type lead telluride) that operates effectively over a lower temperature range than element 2. Likewise element 6 of leg 10 of FIGURE 2 is comprised of a modified "n" type matrix (e.g., "n" type cerium sulfide) capable of operating effectively over a temperature range extending downward from the temperature of the heat source by as much as several hundred degrees Centigrade, and elements 7 and 8 are comprised of modified "n" type matrix materials (e.g., "n" type indium arsenic phosphide and lead selenide) which operate more effectively at lower temperatures than element 6. In all such cases the matrix material before modification must meet the criteria that their electrical resistivities fall in the range of $1\times10^{-4}$ ohm-cm. to $1\times10^{3}$ ohm-cm., their thermal conductivities lie within the range of $1\times10^{-3}$ watt/cm. ° C. to 1 watt/cm. ° C. and their Seebeck coefficients in the range of 50 microvolts/° C. to 1000 microvolts/° C.

*Example 7*

A specific example of the power producing characteristics of devices made in accordance with the present invention is shown when a simple thermoelectric device consisting of a modified matrix unit made as described in Example 1 is equipped with electrical and thermal contacts, elements 21 and 22 of FIGURE 1 and connected to a matched resistance load and powermeter. When an energy source is used to heat the hot junction of this unit to 1350° C. and a calorimetric heat sink provided to cool the cold junction of this unit to 450° C., 11 watts of electrical power output are produced for a heat power input of 0.0947 B.t.u. per second. By comparison, the power output of an unmodified matrix unit of the same cross sectional area of Example 1 is only 6 watts for the same heat power input. This example shows that some power loss occurs at the junction of the electrical and thermal leads to the thermoelectric materials or that the theoretically possible maximum efficiency that can be calculated from the Z factors of the modified and unmodified thermoelectric materials is not achieved. Nevertheless, the advantage of the modified matrix material over the unmodified is a significant 83% in power generation capability under the same temperature or thermal flux conditions.

Other silicons, herein also called silicides, which may be used include the germanium-silicon materials.

What is claimed is:

1. As an article of manufacture, a shaped body comprising a matrix of a semiconductor characterized by an electrical resistivity in the range of $1\times10^{-4}$ ohm-cm. to $1\times10^{3}$ ohm-cm. with a thermal conductivity in the range of $1\times10^{-3}$ to 1 watt/cm. ° C. and a Seebeck coefficient in the range of 50 microvolts per ° C. to 1000 microvolts per ° C., the said matrix having dispersed therein a particulate, substantially insoluble, refractory, dispersed phase having an absolute melting point of at least 105% of the melting point of the aforesaid matrix, and having a coefficient of expansion greater than that of the said matrix, and being selected from the group consisting of the carbides of boron, thorium, aluminum, magnesium, calcium, titanium, zirconium, tantalum, silicon, vanadium, hafnium, columbium, tungsten, iron, tin, cobalt, nickel, rhenium, molybdenum, beryllium, barium and rare earths of the lanthanide and actinide series.

2. An article as in claim 1 in which the dispersed particulate material has a particle size of from 50 angstroms to 500,000 angstroms and is gradated from a maximum of 49 volume percent at one end of the said shaped body to a minimum of 0.001 volume percent at the other end and in which the particle-to-particle spacing within the shaped body is from 50 angstroms to 500,000 angstroms.

3. Process for converting heat into electricity which comprises applying heat to a hot junction element in physical and electrical contact with a first leg, of p-type conductivity, and a second leg, of n-type conductivity, said legs junction element forming a first thermoelectric junction, at least one of said legs being comprised of a matrix of at least one semiconductor characterized by an electrical resistivity in the range of $1\times10^{-4}$ ohm-cm. to $1\times10^{3}$ ohm-cm. with a thermal conductivity in the range of $1\times10^{-3}$ to one watt/cm. ° C. and a Seebeck coefficient in the range of 50 microvolts/° C. to 1000 microvolts/° C., the said matrix having uniformly dispersed therein a particulate, substantially insoluble, refractory, dispersed phase having an absolute melting point of at least 105% of the melting point of the aforesaid matrix, and having a coefficient of expansion greater than that of the said matrix selected from the group consisting of stable compounds of the carbides of boron, thorium, aluminum, magnesium, calcium, titanium, zirconium, tantalum, silicon, vanadium, hafnium, columbium, tungsten, iron, tin, cobalt, nickel, rhenium, molybdenum, beryllium, barium and rare earths of the lanthanide and actinide series cooling the cold junction element in physical and electrical contact with said first and second legs, remote from the said hot junction and forming a second thermoelectric junction, and withdrawing electricity from said cold junction.

4. Process as in claim 3 in which the additive particulate material has an absolute melting point of at least 115% of the melting point of the matrix material.

5. The process for converting electricity into cooling and heating effects which comprises applying electricity to a cold junction element in physical and electrical contact with a first leg, of p-type conductivity, and a second leg, of n-type conducitivity, said legs, and cold junction element forming a first thermoelectric junction and said legs and a hot junction forming a second thermoelectric junction, at least one of said legs being comprised of a matrix of at least one semiconductor segment characterized by an electrical resistivity in the range of $1\times10^{-4}$ ohm-cm. to $1\times10^{3}$ ohm-cm., with a thermal conductivity in the range of $1\times10^{-3}$ to 1 watt/cm. ° C. and a Seebeck coefficient in the range of 50 microvolts per ° C. to 1000 microvolts per ° C. the said matrix having dispersed therein a particulate, substantially insoluble, refractory, dispersed phase having an absolute melting point of at least 105% of the melting point of the aforesaid matrix, and having a coefficient of expansion greater than that of the said matrix and being selected from the group consisting of compounds of the carbides of boron, thorium, aluminum, magnesium, calcium, titanium, Zr, tantalum, silicon, vanadium, hafnium, columbium, tungsten, iron, tin, cobalt, nickel, rhenium, molybdenum, beryllium, barium and rare earths of the lanthanide and actinide series, thereby cooling the cold junction element in physical and electrical contact with said first and second legs, remote from the said hot junction and forming a second thermoelectric junction.

6. A thermoelectric unit comprising at least one shaped body, electrical leads at opposed portions of the said body, the said body comprising a matrix of at least one segment of a semiconductor characterized by an electrical resistivity in the range of $1\times10^{-4}$ ohm-cm. to $1\times10^{+3}$ ohm-cm. with a thermal conductivity in the range of $1\times10^{-3}$ to 1 watt/cm. ° C. and a Seebeck coefficient in the range of 50 microvolts per ° C. to 1000 microvolts per ° C., the said matrix having dispersed therein a particulate, substantially insoluble, refractory, dispersed phase having an absolute melting point of at least 105% of the melting point of the aforesaid matrix, and having a coefficient of expansion greater than that of the said matrix, and being selected from the group consisting of compounds of the carbides of boron, thorium, aluminum, magnesium, calcium, titanium, zirconium, tantalum, silicon, vanadium, hafnium, columbium, tungsten, iron, tin, cobalt, nickel, rhenium, molybdenum, beryllium, barium and rare earths of the lanthanide and actinide series.

7. A thermoelectric unit as in claim 6 in which the dispersed particulate material has a particle size of from 50 angstroms to 500,000 angstroms.

8. A thermoelectric unit as described in claim 6 in which there is a gradation in concentration of the dispersed particulate additive material from the respective opposed regions to be subjected to heat and to cold.

9. A thermoelectric unit as in claim 6 in which the dispersed particulate material has a particle size of from 50 A. to 500,000 A. and is graduated in concentration within the shaped body from the highest concentration of up to 49% at the hot end of the shaped body to more than 0.001 volume percent at the cold end and with the particle-to-particle spacing of the dispersed particulate material at the hot end being in the range of from 50 to 50,000 angstroms.

References Cited by the Examiner

UNITED STATES PATENTS

| | | | |
|---|---|---|---|
| 1,075,773 | 10/1913 | Ferra | 136—5.5 |
| 1,897,214 | 2/1933 | Ridgeway | 23—208 |
| 2,094,102 | 9/1937 | Fritterer | 136—5.4 |
| 2,152,153 | 3/1939 | Ridgeway | 136—5 |
| 2,955,145 | 10/1960 | Schrewelius | 136—5 |
| 2,977,399 | 3/1961 | Johnston et al. | 136—5 |
| 3,051,767 | 8/1962 | Frederick et al. | 136—5 |
| 3,095,330 | 6/1963 | Epstein et al. | 136—5 |

FOREIGN PATENTS

| | | |
|---|---|---|
| 415,584 | 8/1934 | Great Britain. |

OTHER REFERENCES

Fuschillo: "Proc. Phys. Soc. (London)" (1952).

WINSTON A. DOUGLAS, *Primary Examiner.*

JOHN H. MACK, MURRAY TILLMAN, *Examiners.*

D. L. WALTON, A. M. BEKELMAN, *Assistant Examiners.*

UNITED STATES PATENT OFFICE
CERTIFICATE OF CORRECTION

Patent No. 3,256,701 June 21, 1966

Courtland M. Henderson

It is certified that error appears in the above identified patent and that said Letters Patent are hereby corrected as shown below:

Column 9, line 52, "disposed" should read -- dispersed --. Column 12, line 23, "graduated" should read -- gradated --; line 29, "50,000" should read -- 500,000 --.

Signed and sealed this 11th day of November 1969.

(SEAL)
Attest:

Edward M. Fletcher, Jr.
Attesting Officer

WILLIAM E. SCHUYLER, JR.
Commissioner of Patents